US011385273B2

(12) United States Patent
Peng et al.

(10) Patent No.: US 11,385,273 B2
(45) Date of Patent: Jul. 12, 2022

(54) VOLTAGE MEASUREMENT METHOD AND APPARATUS

(71) Applicants: STATE GRID CHONGQING ELECTRIC POWER CO. ELECTRIC POWER RESEARCH INSTITUTE, Yubei District Chongqing (CN); STATE GRID CORPORATION OF CHINA, Xicheng District Beijing (CN)

(72) Inventors: Wenxin Peng, Chongqing (CN); Xingzhe Hou, Chongqing (CN); Ke Zheng, Chongqing (CN); Xiaorui Hu, Chongqing (CN); Songnong Li, Chongqing (CN); Wenli Chen, Chongqing (CN); Jun Ye, Chongqing (CN); Full Yang, Chongqing (CN); Xingzhi Liu, Chongqing (CN)

(73) Assignees: STATE GRID CHONGQING ELECTRIC POWER CO. ELECTRIC POWER RESEARCH INSTITUTE, Chongqing (CN); STATE GRID CORPORATION OF CHINA, Beijing (CN)

( * ) Notice: Subject to any disclaimer, the term of this patent is extended or adjusted under 35 U.S.C. 154(b) by 182 days.

(21) Appl. No.: 17/041,597

(22) PCT Filed: Nov. 5, 2019

(86) PCT No.: PCT/CN2019/115525
§ 371 (c)(1),
(2) Date: Sep. 25, 2020

(87) PCT Pub. No.: WO2020/119331
PCT Pub. Date: Jun. 18, 2020

(65) Prior Publication Data
US 2021/0088571 A1 Mar. 25, 2021

(30) Foreign Application Priority Data

Dec. 12, 2018 (CN) .......................... 201811517608.6

(51) Int. Cl.
*G01R 29/14* (2006.01)
*G01R 29/08* (2006.01)
(Continued)

(52) U.S. Cl.
CPC ......... *G01R 29/14* (2013.01); *G01R 19/0084* (2013.01); *G01R 29/0878* (2013.01); *G02B 6/0008* (2013.01); *G02B 27/0972* (2013.01)

(58) Field of Classification Search
CPC .... G01R 29/00; G01R 29/08; G01R 29/0864; G01R 29/0878; G01R 29/12; G01R 29/14;
(Continued)

(56) References Cited

FOREIGN PATENT DOCUMENTS

CN 101696990 A 4/2010
CN 102262179 A * 11/2011 ............. G01R 19/25
(Continued)

OTHER PUBLICATIONS

International Search Report for PCT/CN2019/115525 dated Feb. 5, 2020 in English Translation.
(Continued)

*Primary Examiner* — Hoai-An D. Nguyen
(74) *Attorney, Agent, or Firm* — ArentFox Schiff LLP

(57) ABSTRACT

Provided are a voltage measurement method and apparatus. The method includes following steps: a number j of height values are selected in a vertical direction of a transmission line, a number m of sensors used for measuring, according to a Stark effect, electric field strength of a corresponding spatial position are arranged in sequence at each of j spatial positions of the j heights from the ground, electric field
(Continued)

strength values of the corresponding spatial position are measured through the m sensors respectively, and an electric field strength average value of the corresponding spatial position is calculated according to the acquired m electric field strength values, where j and m are positive integers, and the j spatial positions are below the transmission line; a voltage of the transmission line is calculated according to j electric field strength average values.

11 Claims, 4 Drawing Sheets

(51) Int. Cl.
    *G01R 19/00*     (2006.01)
    *G02B 27/09*     (2006.01)
    *F21V 8/00*     (2006.01)

(58) Field of Classification Search
    CPC ...... G01R 15/00; G01R 15/14; G01R 15/144; G01R 15/146; G01R 15/22; G01R 15/24; G01R 15/241; G01R 19/00; G01R 19/0084; G01R 19/0092; G02B 6/00; G02B 6/0001; G02B 6/0005; G02B 6/0008; G02B 6/24; G02B 6/27; G02B 6/2706; G02B 6/36; G02B 6/3616; G02B 6/3624; G02B 27/00; G02B 27/09; G02B 27/0938; G02B 27/095; G02B 27/0972
    See application file for complete search history.

(56) References Cited

FOREIGN PATENT DOCUMENTS

| | | |
|---|---|---|
| CN | 103616571 A | 3/2014 |
| CN | 104020343 A | 9/2014 |
| CN | 104880614 A | 9/2015 |
| CN | 105866559 A | 8/2016 |
| CN | 106645865 A | 5/2017 |
| CN | 108152602 A | 6/2018 |
| CN | 108982975 A | 12/2018 |
| CN | 109342838 A | 2/2019 |
| JP | H036465 A | 1/1991 |
| JP | H04359164 A | 12/1992 |

OTHER PUBLICATIONS

First Office Action received corresponding to Chinese aplication 201811517608.6 dated Jun. 2, 2020 with Machine Translation.

* cited by examiner

VOLTAGE MEASUREMENT METHOD AND APPARATUS

CROSS-REFERENCES TO RELATED APPLICATIONS

This is a National Stage Application, filed under 35 U.S.C. 371, of International Patent Application Number PCT/CN2019/115525, filed on Nov. 5, 2019, which claims priority to Chinese patent application No. 201811517608.6 filed on Dec. 12, 2018, the contents of which are incorporated herein by reference in their entireties.

TECHNICAL FIELD

The present disclosure relates to the technical field of high voltage power frequency electric field, for example, to a voltage measurement method and apparatus.

BACKGROUND

A Rydberg atom is an atom in which the outermost electron is excited to a high excited state with a greater number of main quanta. Compared with a ground state atom, the Rydberg atom has a lot of unique properties, for example, a long lifetime, a little energy-level interval, and large electric dipole moment. Meanwhile, electric field susceptibility of the Rydberg atom is high (which is proportional to the seventh power of the number of main quanta). The Rydberg atom is very susceptible to an external electric field. Atomic energy levels of the Rydberg atom shift or deviate under the action of the external electric field, that is, a Stark effect.

As early as the last century, the atom has been widely used as a measurement standard due to its renewability, accuracy and high stability. In the related arts, the precision of an atomic clock is already higher than As early as the last century, the atom has been widely used as a measurement standard due to its renewability, accuracy and high stability. In the related arts, the precision of an atomic clock is already higher than $1/10^{14}$. Recently, great progress is made in measuring the magnetic field through utilizing the atom as a standard, and the measurement precision can reach fTHz$^-$$_{1/2}$. In the fields such as space object identification and global positioning, a detectable space electric field is relatively weak, and an accurate detection of the electric field (mV/cm) may be implemented through utilizing the measurement of the atomic energy levels. An electric field detection based on the atomic energy levels is mainly used for measurement of a microwave signal or a higher frequency band signal, and has no application to a low frequency signal. Meanwhile, a low frequency measurement device has an inaccurate measuring result, low sensitivity, large equipment volume and is difficult to carry. In addition, in the related arts, Chinese patent application No. CN103616571A merely discloses the measurement for weak electric field, and lacks a measurement method for a high voltage power frequency electric field and voltage.

SUMMARY

The present disclosure provides a voltage measurement method and apparatus.

According to the voltage measurement method, alkali metal atoms are excited to a Rydberg state, and a space voltage is measured through utilizing the Stark effect that the Rydberg atom generates energy level splitting under the action of an external electric field and through a relation between the degree of atomic energy level splitting and external electric field strength.

The present disclosure provides a high voltage power frequency voltage measurement method. The method includes steps described below.

A number j of height values are selected in a vertical direction of a transmission line, a number m of sensors used for measuring, according to a Stark effect, electric field strength of a corresponding height are arranged in sequence at each of j spatial positions of the j height values from a ground, electric field strength values of a corresponding spatial position are measured through the m sensors respectively, and an electric field strength average value of the corresponding spatial position is calculated according to the m electric field strength values, where j and m are positive integers, and the j spatial positions are below the transmission line.

A voltage of the transmission line is calculated according to j electric field strength average values.

In an embodiment, the step in which the electric field strength values of the corresponding spatial position are measured through the m sensors respectively includes steps described below.

At a measurement end of each sensor, an alkali metal atom sample cell of the each sensor is disposed in a space to be measured corresponding to the each sensor, and a first beam of laser is directed into the alkali metal atom sample cell to cause alkali metal atoms in the alkali metal atom sample cell to reach a first excited state.

A second beam of laser is directed into the alkali metal atom sample cell to excite the alkali metal atoms in the first excited state to a Rydberg state in the case where the second beam of laser and the first beam of laser are oppositely and collinearly incident into the alkali metal atom sample cell.

An emitting laser signal of the first beam of laser after passing through the alkali metal atom sample cell is acquired, and the emitting laser signal is converted into a corresponding electric signal.

The converted electric signal is analyzed, the converted electric signal is compared with a measurement signal without an electric field, and it is determined whether an electric field exists in the space to be measured corresponding to the each sensor.

Under the condition that an electric field exists in the space to be measured corresponding to the each sensor, an electric field strength value of the each sensor in the corresponding spatial position is calculated according to the emitting laser signal.

In an embodiment, the first beam of laser excites the alkali metal atoms to the first excited state through a first specified wavelength, and the second beam of laser excites the alkali metal atoms in the first excited state to the Rydberg state through a second specified wavelength.

In an embodiment, the step in which the electric field strength average value of the corresponding spatial position is calculated according to the acquired m electric field strength values includes a following step: the electric field strength average value is calculated through a following formula:

$$E_x = \frac{\sum_{n=1}^{m} E_{s_n}(x)}{m}.$$

Here, $E_x$ is an electric field strength average value at height x from the ground, $E_{s_n}(x)$ is an electric field strength value corresponding to an n-th sensor at the height x from the ground, and m is the number of sensors.

In an embodiment, the step in which the voltage of the transmission line is calculated according to the j electric field strength average values includes steps described below.

Expression F(x) of the electric field strength is fitted through a least-squares method according to the j electric field strength average values, where x represents a height value.

The voltage of the transmission line is calculated according to a following formula:

$$U_{line} = \int_0^h F(x)dx$$

Here, $U_{line}$ is the voltage of the transmission line, and h is the height of the transmission line.

The present disclosure further provides a voltage measurement apparatus. The apparatus includes multiple sensor units and a comprehensive platform.

Each sensor unit includes an optical fiber input or output end, a reflection prism and an alkali metal atom sample cell. The multiple sensor units are distributed in a high voltage power frequency electric field space where a Stark effect occurs. The multiple sensor units are configured to measure electric field strength values of different spatial positions. The different spatial positions are spatial positions below a transmission line and at each of a number j of height values selected in a vertical direction of the transmission line from a ground, the number of the multiple sensor units is m, and j and m are positive integers.

The comprehensive platform is connected to the each sensor unit through the optical fiber input or output end of the each sensor unit. The comprehensive platform includes a laser group, a signal receiver and a data analysis unit.

The laser group is configured to collinearly and oppositely emit a first beam of laser and a second beam of laser into the alkali metal atom sample cell of the each sensor unit through the reflection prism of the each sensor unit. A wavelength of the first beam of laser is different from a wavelength of the second beam of laser. The first beam of laser is used for causing alkali metal atoms in the alkali metal atom sample cell of the each sensor unit to reach a first excited state, and the second beam of laser is used for exciting the alkali metal atoms in the first excited state to a Rydberg state.

The signal receiver is configured to receive an emitting laser signal of the first beam of laser after passing through the alkali metal atom sample cell of the each sensor unit, and convert the emitting laser signal of the first beam of laser after passing through the alkali metal atom sample cell of the each sensor unit into an electric signal.

The data analysis unit is configured to analyze the converted electric signal corresponding to the each sensor unit, determine whether an electric field exists in a space to be measured corresponding to the each sensor unit, under the condition that an electric field exists in the space to be measured corresponding to the each sensor unit, calculate an electric field strength value of the each sensor unit in the corresponding space position according to the emitting laser signal, acquire a corresponding electric field strength average value according to the m electric field strength values of the same space position, and calculate a voltage of the transmission line according to j electric field strength average values.

In an embodiment, the each sensor unit further includes a non-metallic shell. The optical fiber input/output end, the reflection prism and the alkali metal atom sample cell are arranged in the non-metallic shell. A lower end of the each sensor unit is further provided with a non-metallic base. The non-metallic base is configured to cause an optical fiber to connect the laser group in the comprehensive platform through the non-metallic base.

In an embodiment, the apparatus is configured to measure at least one voltage of a low-voltage line, a substation, or a non-contact power transformer for power equipment state monitoring and based on an electric field measurement principle.

According to the above technical scheme, the present disclosure has the following advantages: in the present disclosure, the space electric field strength is measured through using the alkali metal atoms excited to the Rydberg state and the Stark effect that the Rydberg atom generates energy level splitting under the action of an external electric field, so that the electric field to be measured does not generate distortion, the measurement precision is high, and the temperature stability is high.

DETAILED DESCRIPTION

The present disclosure will be described hereinafter in conjunction with the drawings and embodiments.

Figure 1:
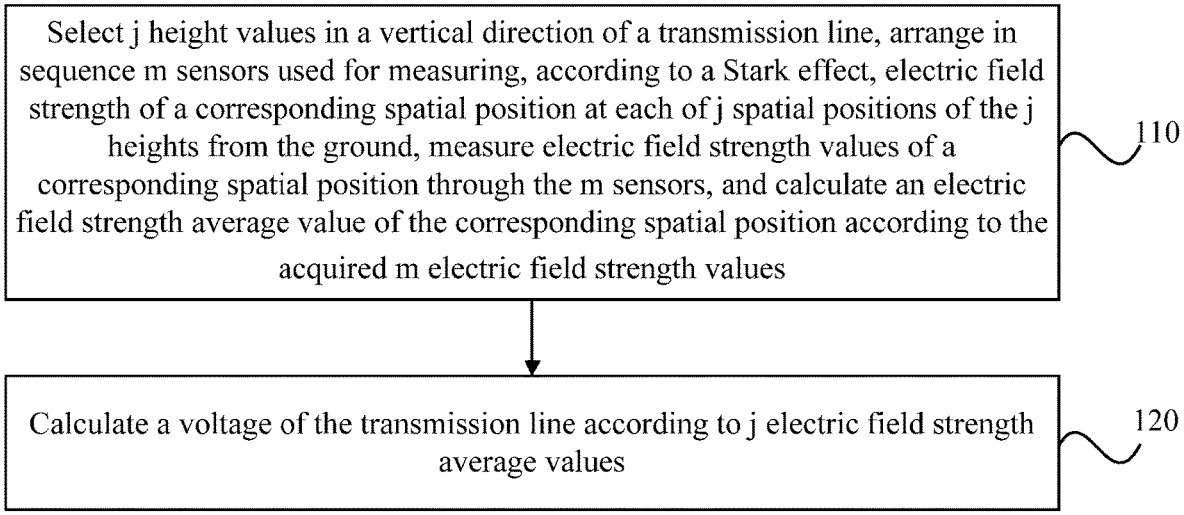
FIG. 1 is a flowchart of a voltage measurement method according to an embodiment of the present disclosure.

FIG. 1 is a flowchart of a voltage measurement method according to an embodiment of the present disclosure. As shown in FIG. 1, the voltage measurement method provided by the embodiment of the present disclosure includes steps described below.

In step 110, j height values are selected in a vertical direction of a transmission line, m sensors used for measuring, according to a Stark effect, electric field strength of a corresponding spatial position are arranged in sequence at each of j spatial positions of the j height values from the ground, electric field strength values of a corresponding spatial position are measured through the m sensors respectively, and an electric field strength average value of the corresponding spatial position is calculated according to the acquired m electric field strength values, where j and m are positive integers, and the j spatial positions are below the transmission line.

In step 120, a voltage of the transmission line is calculated according to j electric field strength average values.

Figure 2:
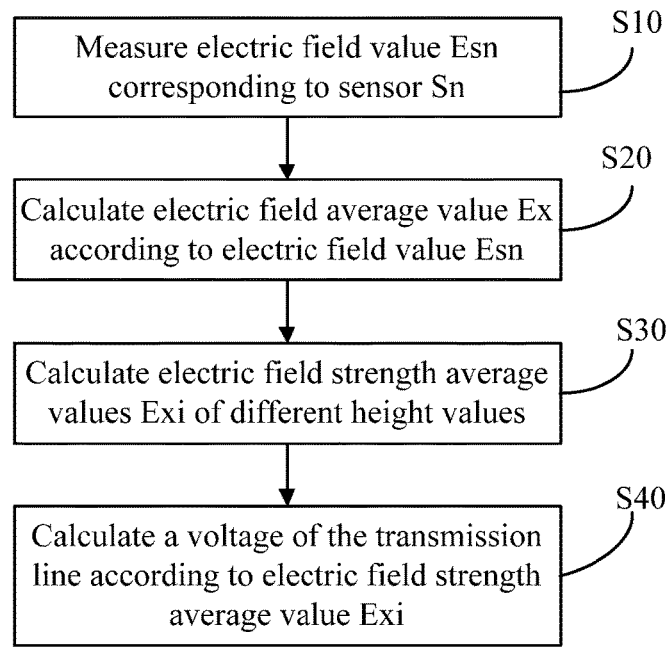
FIG. 2 is a flowchart of another voltage measurement method according to an embodiment of the present disclosure.

FIG. 2 is a flowchart of another voltage measurement method according to an embodiment of the present disclosure. As shown in FIG. 2, the voltage measurement method provided by the embodiment of the present disclosure includes steps described below.

In step S10, m sensors used for measuring, according to a Stark effect, electric field strength of a corresponding height are arranged in a space below a transmission line and at height x from the ground, and electric field value Esn (n=1, 2, 3 . . . m) corresponding to sensor Sn (n=1, 2, 3 . . . m) is measured.

In step S20, electric field average value Ex is calculated according to electric field value Esn.

In step S30, j height values Xi (i=1, 2, 3 . . . j) are selected in the vertical direction of the transmission line, and step S10 and step S20 are repeated to calculate electric field strength average values Exi of different height values.

In step S40, a voltage of the transmission line is calculated according to electric field strength average value Exi.

A measurement progress of the electric field values in step S10 includes steps described below.

First, at a measurement end of sensor Sn, a sample cell filled with alkali metal atom gas is disposed in a space to be measured, and a first beam of laser is directed into the sample cell to cause alkali metal atoms to reach a first excited state.

Second, a second beam of laser is directed into the sample cell to excite the alkali metal atoms in the excited state to a Rydberg state. The second beam of laser and the first beam of laser are oppositely and collinearly incident into the sample cell.

Third, an emitting laser signal of the first beam of laser after passing through the sample cell is acquired, and the emitting laser signal is converted into a corresponding electric signal and directed back to a comprehensive platform.

Fourth, the converted electric signal is analyzed, the converted electric signal is compared with a measurement signal without an electric field, and it is determined whether an electric field exists in the space to be measured.

In the embodiment, under the condition that no electric field exists in the space to be measured, the measurement signal exhibits a narrow single peak in a frequency spectrum, whereas under the condition that an electric field exists in the space to be measured, the measurement signal exhibits a double peak in the frequency spectrum due to the energy level splitting.

Fifth, under the condition that an electric field exists in the space to be measured, the existing electric field causes the alkali metal atoms to generate the Stark effect, that is, the Rydberg energy level is split. An absorption spectrum signal of the first beam of laser is acquired, and the electric field value is calculated according to a relation between the energy level splitting and the electric field strength.

In an embodiment, firstly, alkali metal atomic vapor is filled into a vacuum sealed glass air plenum. The vacuum sealed glass air plenum is a cube with the side length of 5 cm or a cylinder with the height of 5 cm and the diameter of 5 cm. The atmospheric pressure is $10^4$ Pa. The sample cell is a contact end for measuring a space electric field.

The sample cell filled with the alkali metal atom gas is disposed into the space to be measured, and an optical fiber is used for directing the first beam of laser into the sample cell. The incident first beam of laser causes the alkali metal atoms to reach the first excited state. The emitting laser at the other side is directed back to the comprehensive platform, acquired by a detector, and converted into a display signal of computer equipment.

The optical fiber is used for directing the second beam of laser to be incident into the sample cell in a direction opposite to the first beam of laser for eliminating a Doppler effect. The second beam of laser excites the alkali metal atoms to the Rydberg state.

The alkali metal atoms in the Rydberg state have strong electric field sensibility. If no electric field exists in the space, a specific wavelength absorption peak of the single stable first beam of laser is observed in the computer screen. If an electric field exists in the space, an absorption peak with a value different from zero electric field state is observed in the computer screen because the energy level splitting of the Rydberg atom occurs. If the existing electric field is an alternating electric field, the single peak vibrates at a frequency of the alternating electric field, and vibration amplitude of the single peak is proportional to the electric field strength in a certain range.

This method can be traced to basic physical quantities, and can significantly improve the measurement precision based on the measurement in the related arts. The measurement end in this method is non-metallic, so that a distortion effect on the original electric field cannot be caused. Thus, the measuring accuracy is improved.

Figure 3A:
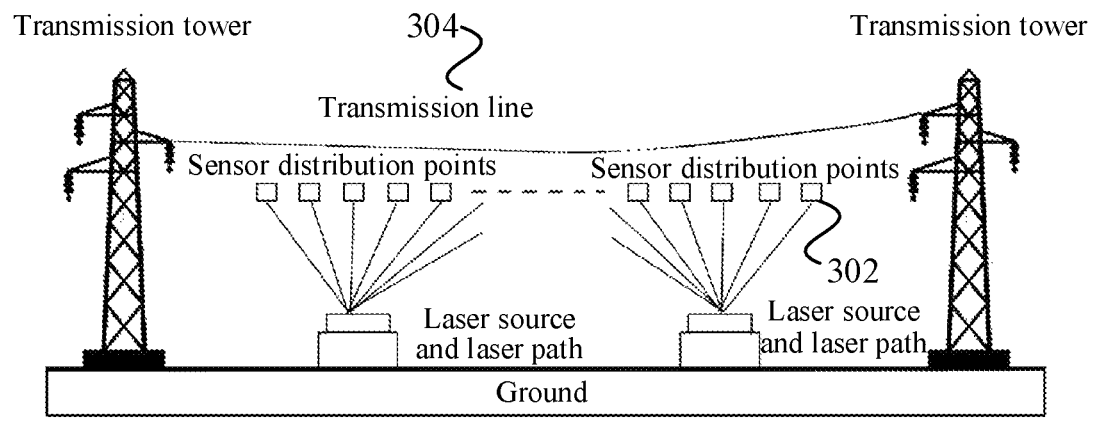
FIG. 3A is a schematic diagram of calculating a voltage through sensors in an electric field according to an embodiment of the present disclosure.
Figure 3B:
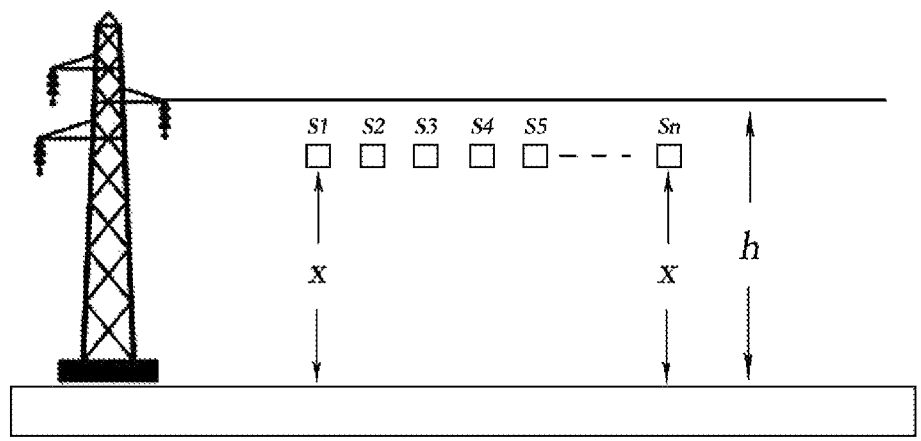
FIG. 3B is a schematic diagram of another calculating a voltage through sensors in an electric field according to an embodiment of the present disclosure.

As shown in FIGS. 3A and 3B, the high voltage power frequency measurement method is provided: the sensors 302 are distributed below the transmission line 304, and the distance between each sensor and the ground is equal.

(1) In an operating state, the m sensors used for measuring, according to the Stark effect, the electric field strength of a corresponding height are arranged in the space below the transmission line and at height x from the ground, electric field value $E_{s_n}(x)$ (n=1, 2, 3 . . . m) corresponding to sensor Sn (n=1, 2, 3 . . . m) is measured. The average value of the m electric field values is calculated through the following formula:

$$E_x = \frac{\sum_{n=1}^{m} E_{s_n}(x)}{m}.$$

(2) The j heights (x1, x2 . . . xj) are selected in the vertical direction. The calculations in the first step are performed respectively, and a set of electric field strength (Ex1, Ex2 . . . Exj) of different height values from the ground (or the transmission line) are measured.

Expression F(x) of electric field $E_{eletric\ field}(x)$ is fitted through a least-squares method and the electric field strength measurement values (Ex1, Ex2 . . . Exj). A specific function needs to be selected according to an actual measurement result, and a fitting result of F(x) is a result considering external environment factors such as a specific place, temperature, and electromagnetic interference.

(3) The voltage of the transmission line is calculated according to a following voltage calculation formula:

$$U_{line} = \int_0^h E_{eletric\ field}(x)dx = \int_0^h F(x)dx.$$

Here, $U_{line}$ is the voltage of the transmission line, and h is the height of the transmission line.

Figure 4:
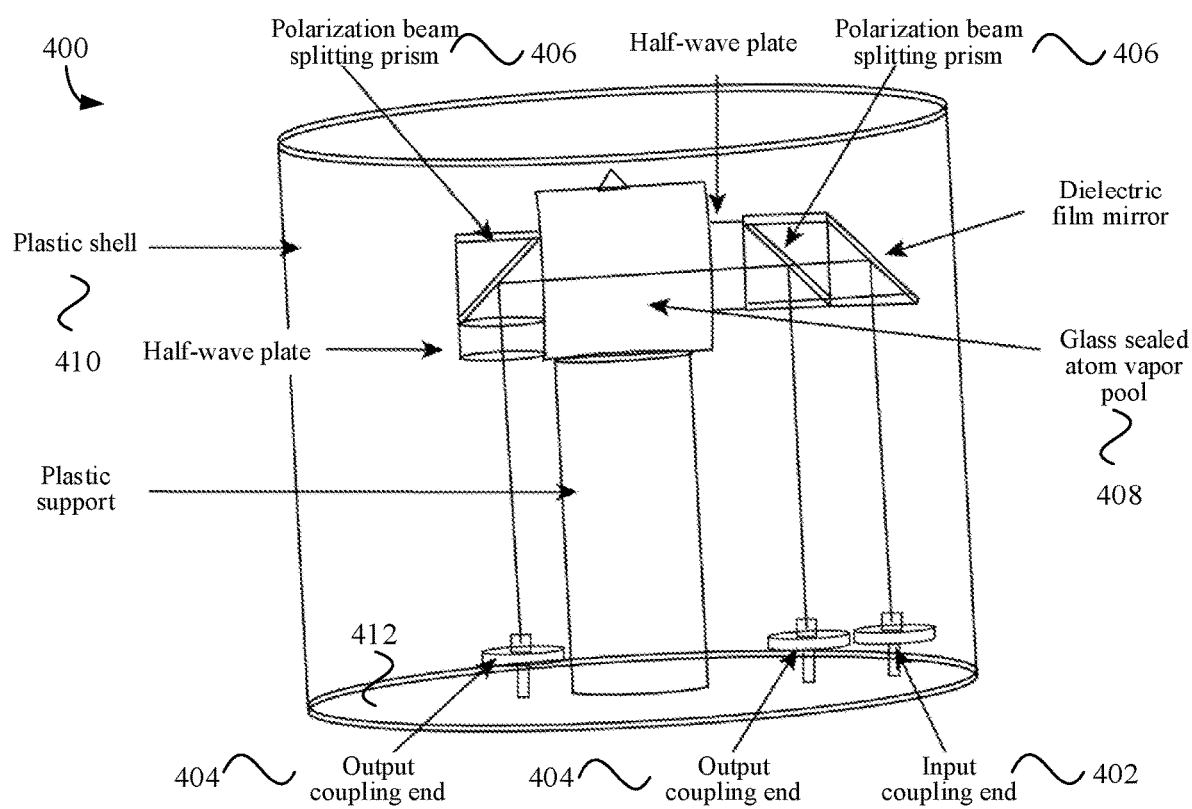
FIG. 4 is a structural diagram of a sensor unit according to an embodiment of the present disclosure.
Figure 5:
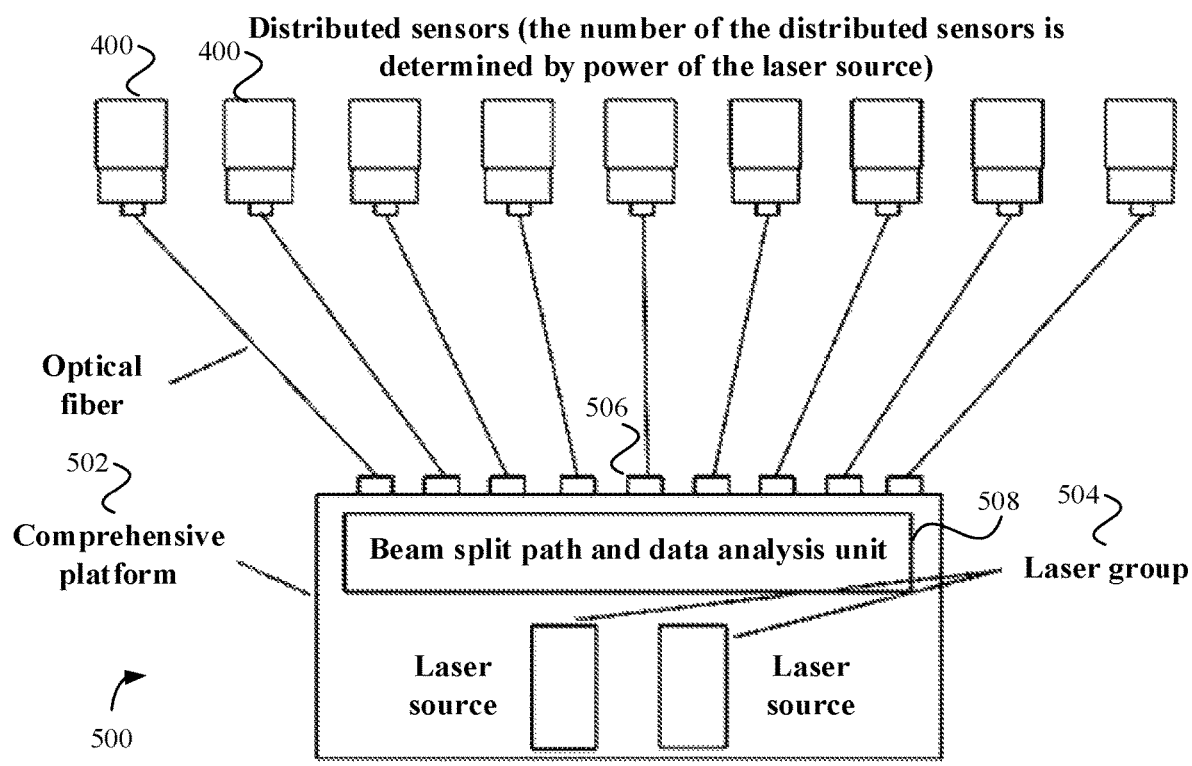
FIG. 5 is an overall schematic diagram of a voltage measurement apparatus according to an embodiment of the present disclosure.

As shown in FIG. 4 and FIG. 5, the embodiment of the present disclosure provides a voltage measurement apparatus 500. The apparatus includes sensor units 400 and a comprehensive platform 502. The sensor unit 400 includes an optical fiber input/output end 402, 404, a reflection prism 406 and an alkali metal atom sample cell 408. The sensor units are distributed in a high voltage power frequency electric field space where the Stark effect occurs, and the sensor units are configured to measure electric field values of different spatial positions.

The sensor unit further includes a non-metallic shell 410. The optical fiber input/output end 402, 404, the reflection prism 406 and the alkali metal atom sample cell 408 are arranged in the non-metallic shell 410. A lower end of the sensor unit is further provided with a non-metallic base 412. A laser group 504 is connected through the non-metallic base 412.

The comprehensive platform 502 is connected to the multiple sensor units 400. The comprehensive platform includes a laser group 504, a signal receiver 506 and a data analysis unit 508. The laser group 504 is configured to, after being light split, collinearly and oppositely emit two beams of laser with different wavelengths into the alkali metal atom sample cell 408 through the reflection prism 406. The signal receiver 506 is configured to receive an emitting laser signal and a laser absorption spectrum signal after passing through the alkali metal atom sample cell, and convert the emitting laser signal into an electric signal. The data analysis unit 508 is configured to analyze the converted electric signal and the laser absorption spectrum signal, and calculate the electric field value and the voltage according to an analysis result.

The two beams of laser emitted by the laser group 504 excite the alkali metal atoms to the first excited state and the Rydberg state through using different specified wavelengths respectively.

According to the present disclosure, the space electric field strength is measured through using the alkali metal atoms excited to the Rydberg state, the Stark effect that the Rydberg atom generates the energy level splitting under the action of the external electric field, and the relation between the degree of atomic energy level splitting and the external electric field strength. The present disclosure is suitable for high voltage power frequency measurement of the transmission line and the substation, and non-contact measurement for the voltage based on the method.

It should be understood by those skilled in the art that the embodiments of the present application may be provided as methods, systems and computer program products. Therefore, the present disclosure can take the form of a complete hardware embodiment, a complete software embodiment, or a combination of software and hardware embodiments. In addition, the present disclosure may take the form of a computer program product implemented on one or more computer-usable storage media (including, but not limited to, a disk memory, compact disc read-only memory (CD-ROM) and an optical memory) that includes computer-usable program codes.

The present disclosure is described with reference to flowcharts and/or block diagrams of methods, apparatus (systems) and computer program products according to the embodiments of the present disclosure. It should be understood that computer program instructions implement each flow and/or block in the flowcharts and/or block diagrams and a combination of flows and/or blocks in the flowcharts and/or block diagrams. These computer program instructions may be provided to a general-purpose computer, a special-purpose computer, an embedded processor or a processor of another programmable data processing apparatus to produce a machine so that instructions executed by a computer or a processor of another programmable data processing apparatus produce a device for implementing the functions specified in one or more flows in the flowcharts and/or one or more blocks in the block diagrams.

These computer program instructions may also be stored in a computer-readable memory which can direct a computer or another programmable data processing apparatus to operate in a particular manner so that the instructions stored in the computer-readable memory produce a manufactured product including an instruction device. The instruction device implements the functions specified in one or more flows in the flowcharts and/or one or more blocks in the block diagrams.

These computer program instructions may also be loaded onto a computer or another programmable data processing apparatus so that a series of operation steps are performed on the computer or another programmable apparatus to produce processing implemented by a computer. Therefore, instructions executed on a computer or another programmable apparatus provide steps for implementing the functions specified in one or more flows in the flowcharts and/or one or more blocks in the block diagrams.

What is claimed is:

1. A voltage measurement method, comprising:
   selecting a number j of height values in a vertical direction of a transmission line, arranging in sequence a number m of sensors used for measuring, according to a Stark effect, electric field strength of a corresponding height at each of j spatial positions of the j height values from a ground, measuring electric field strength values of a corresponding spatial position through the m sensors respectively, and calculating an electric field strength average value of the corresponding spatial position according to the acquired m electric field strength values, wherein j and m are positive integers, and the j spatial positions are below the transmission line; and
   calculating a voltage of the transmission line according to j electric field strength average values.

2. The method of claim 1, wherein measuring the electric field strength values of the corresponding spatial position through the m sensors respectively comprises:
   at a measurement end of each sensor, disposing an alkali metal atom sample cell of the each sensor in a space to be measured corresponding to the each sensor, and directing a first beam of laser into the alkali metal atom sample cell to cause alkali metal atoms in the alkali metal atom sample cell to reach a first excited state;
   directing a second beam of laser into the alkali metal atom sample cell to excite the alkali metal atoms in the first excited state to a Rydberg state in a case where the second beam of laser and the first beam of laser are oppositely and collinearly incident into the alkali metal atom sample cell;
   acquiring an emitting laser signal of the first beam of laser after passing through the alkali metal atom sample cell, and converting the emitting laser signal into a corresponding electric signal;
   analyzing the converted electric signal, comparing the converted electric signal with a measurement signal without an electric field, and determining whether an electric field exists in the space to be measured corresponding to the each sensor; and
   under a condition that an electric field exists in the space to be measured corresponding to the each sensor, calculating an electric field strength value of the each sensor in the corresponding spatial position according to the emitting laser signal.

3. The method of claim 2, wherein the first beam of laser excites the alkali metal atoms to the first excited state from a ground state through a first specified wavelength, and the second beam of laser excites the alkali metal atoms in the first excited state to the Rydberg state through a second specified wavelength.

4. The method of claim 1, wherein calculating the electric field strength average value of the corresponding spatial position according to the acquired m electric field strength values comprises:
calculating the electric field strength average value through a formula of:

$$E_x = \frac{\sum_{n=1}^{m} E_{s_n}(x)}{m};$$

where $E_x$ is an electric field strength average value at height value x from the ground, $E_{s_n}(x)$ is an electric field strength value corresponding to an n-th sensor at height value x from the ground, and m is the number of sensors.

5. The method of claim 1, wherein calculating the voltage of the transmission line according to the j electric field strength average values comprises:
fitting expression F(x) of the electric field strength through a least-squares method according to the j electric field strength average values, wherein x represents a height value;
calculating the voltage of the transmission line according to a formula of:

$$U_{line} = \int_0^h F(x)dx;$$

where $U_{line}$ is the voltage of the transmission line, and h is a height of the transmission line.

6. The method of claim 2, wherein calculating the electric field strength average value of the corresponding spatial position according to the acquired m electric field strength values comprises:
calculating the electric field strength average value through a formula of:

$$E_x = \frac{\sum_{n=1}^{m} E_{s_n}(x)}{m};$$

where $E_x$ is an electric field strength average value at height value x from the ground, $E_{s_n}(x)$ is an electric field strength value corresponding to an n-th sensor at height value x from the ground, and m is the number of sensors.

7. The method of claim 3, wherein calculating the electric field strength average value of the corresponding spatial position according to the acquired m electric field strength values comprises:
calculating the electric field strength average value through a formula of:

$$E_x = \frac{\sum_{n=1}^{m} E_{s_n}(x)}{m};$$

where $E_x$ is an electric field strength average value at height value x from the ground, $E_{s_n}(x)$ is an electric field strength value corresponding to an n-th sensor at height value x from the ground, and m is the number of sensors.

8. A voltage measurement apparatus, comprising: a plurality of sensor units and a comprehensive platform, wherein each sensor unit comprises an optical fiber input or output end, a reflection prism and an alkali metal atom sample cell; the plurality of sensor units is distributed in a high voltage power frequency electric field space where a Stark effect occurs; the plurality of sensor units is configured to measure electric field strength values of different spatial positions; the different spatial positions are spatial positions below a transmission line and at each of a number j of height values selected in a vertical direction of the transmission line from a ground, a number of the plurality of sensor units is m, and j and m are positive integers; and
the comprehensive platform is connected to the each sensor unit through the optical fiber input or output end of the each sensor unit, and the comprehensive platform comprises a laser group, a signal receiver and a data analysis unit;
wherein the laser group is configured to collinearly and oppositely emit a first beam of laser and a second beam of laser into the alkali metal atom sample cell of the each sensor unit through the reflection prism of the each sensor unit, wherein a wavelength of the first beam of laser is different from a wavelength of the second beam of laser, the first beam of laser is used for causing alkali metal atoms in the alkali metal atom sample cell of the each sensor unit to reach a first excited state, and the second beam of laser is used for exciting the alkali metal atoms in the first excited state to a Rydberg state;
wherein the signal receiver is configured to receive an emitting laser signal of the first beam of laser after passing through the alkali metal atom sample cell of the each sensor unit, and convert the emitting laser signal of the first beam of laser after passing through the alkali metal atom sample cell of the each sensor unit into an electric signal; and
wherein the data analysis unit is configured to analyze the converted electric signal corresponding to the each sensor unit, determine whether an electric field exists in a space to be measured corresponding to the each sensor unit, under a condition that an electric field exists in the space to be measured corresponding to the each sensor unit, calculate an electric field strength value of the each sensor unit in the corresponding space position according to the emitting laser signal, acquire an electric field strength average value of the corresponding space position according to the m electric field strength values of a same space position, and calculate a voltage of the transmission line according to j electric field strength average values, wherein j and m are positive integers.

9. The apparatus of claim 8, wherein the each sensor unit further comprises a non-metallic shell, wherein the optical fiber input or output end, the reflection prism and the alkali metal atom sample cell are arranged in the non-metallic shell; and a lower end of the each sensor unit is further provided with a non-metallic base, wherein the non-metallic base is configured to cause an optical fiber to connect the laser group in the comprehensive platform through the non-metallic base.

10. The apparatus of claim 8, wherein the apparatus is configured to measure at least one voltage of: a low-voltage line, a substation, or a non-contact power transformer for power equipment state monitoring and based on an electric field measurement principle.

11. The apparatus of claim 9, wherein the apparatus is configured to measure at least one voltage of: a low-voltage line, a substation, or a non-contact power transformer for power equipment state monitoring and based on an electric field measurement principle.

* * * * *